(12) United States Patent
Park et al.

(10) Patent No.: US 7,879,726 B2
(45) Date of Patent: Feb. 1, 2011

(54) METHODS OF FORMING SEMICONDUCTOR DEVICES USING SELECTIVE ETCHING OF AN ACTIVE REGION THROUGH A HARDMASK

(75) Inventors: Heung-Sik Park, Gyeonggi-do (KR); Jun-Ho Yoon, Gyeonggi-do (KR); Cheol-Kyu Lee, Gyeonggi-do (KR); Joon-Soo Park, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 167 days.

(21) Appl. No.: 12/187,895

(22) Filed: Aug. 7, 2008

(65) Prior Publication Data

US 2009/0042396 A1      Feb. 12, 2009

(30) Foreign Application Priority Data

Aug. 9, 2007    (KR) ................ 10-2007-0080194

(51) Int. Cl.
*H01L 21/311*    (2006.01)

(52) U.S. Cl. ............... 438/700; 438/197; 438/553; 438/733; 438/736; 257/E21.17; 257/E21.058; 257/E21.126; 257/E21.127; 257/E21.231; 257/E21.249; 257/E21.257; 257/E21.259; 257/E21.267; 257/E21.545; 257/E21.632

(58) Field of Classification Search ........... 438/700, 438/736, 733, 752, 753, 553, 197, 933, 606, 438/680, 513, 769, 725; 257/E21.17, 58, 257/126, 127, 231, 249, 257, 259, 267, 545, 257/632

See application file for complete search history.

(56) References Cited

U.S. PATENT DOCUMENTS

| | | | | |
|---|---|---|---|---|
| 7,153,733 | B2* | 12/2006 | Seo et al. | 438/197 |
| 7,429,505 | B2* | 9/2008 | Seo et al. | 438/197 |
| 7,435,682 | B2* | 10/2008 | Matsui et al. | 438/691 |
| 7,508,048 | B2* | 3/2009 | Kang et al. | 257/500 |
| 7,622,808 | B2* | 11/2009 | Ohtake et al. | 257/760 |
| 2002/0173163 | A1* | 11/2002 | Gutsche | 438/736 |

FOREIGN PATENT DOCUMENTS

| | | |
|---|---|---|
| KR | 1020070001489 A | 1/2007 |
| KR | 1020070002840 A | 1/2007 |
| KR | 100695500 B1 | 3/2007 |

* cited by examiner

*Primary Examiner*—David Nhu
(74) *Attorney, Agent, or Firm*—Myers Bigel Sibley & Sajovec, P.A.

(57) ABSTRACT

A method of fabricating a semiconductor device is provided. The method can include forming a hard mask film including lower and upper hard mask films on a substrate in which an active region and an isolation region are defined and patterning the hard mask film to provide a hard mask pattern partially exposing the active region and the isolation region. An etchant can be applied to the active and isolation regions using the hard mask pattern as an etching mask to form a trench in the active region of the substrate while avoiding substantially etching the isolation region exposed to the etchant and a gate can be formed on the trench.

22 Claims, 8 Drawing Sheets

METHODS OF FORMING SEMICONDUCTOR DEVICES USING SELECTIVE ETCHING OF AN ACTIVE REGION THROUGH A HARDMASK

CROSS-REFERENCE TO RELATED APPLICATION

This application claims priority from Korean Patent Application No. 10-2007-0080194 filed on Aug. 9, 2007 in the Korean Intellectual Property Office, the disclosure of which is incorporated herein by reference in its entirety.

FIELD OF THE INVENTION

The present invention relates generally to a method of fabricating a semiconductor device, and more particularly to a method of fabricating a semiconductor device that has a recess channel trench.

BACKGROUND

The design rule of a semiconductor device is rapidly reduced as a semiconductor device not only tends to be compact, slim and lightweight, but is also highly integrated. Consequently, a channel between source and drain electrodes of a transistor can be shortened, which may cause short channel effects in a transistor, with the result that a gate control function may be reduced or lost.

It is known to use a recess channel array transistor (RCAT). The recess channel array transistor has a structure in which a channel of the transistor is lengthened by forming a recess channel trench in a region to be formed into the channel.

In a conventional method of fabricating such a recess channel array transistor, a hard mask pattern is formed on a substrate, a trench is formed in an active region of the substrate by using the hard mask pattern as an etching mask, the hard mask is removed, and then the trench is filled with an electrically conductive material to thereby form a gate.

The hard mask pattern may, for example, be formed in such a manner as to contain a material, such as silicon oxide, silicon nitride, etc. The hard mask pattern may also include a line pattern open area shaped similar to the gate. Thus, the open area of the hard mask pattern may expose part of an isolation region 101, as well as a part of the active region. The trench is formed by etching the active region exposed by the hard mask pattern, and the isolation region exposed by the hard mask pattern is also etched in the course of removing the hard mask pattern, on account of which a field recess may be formed. Subsequently, when the electrically conductive material is filled in the trench formed in the active region, the electrically conductive material may also be deposited in the field recess, so that the gate may be formed in the active and on isolation regions.

However, the gate formed on the field recess in the isolation region may cause coupling noise, resulting from the so-called passing gate effect, to a semiconductor device formed in the active region, which may degrade the characteristics of the semiconductor device.

SUMMARY

Embodiments according to the invention can provide methods of forming semiconductor devices using selective etching of an active region through a hard mask. Pursuant to these embodiments, a method can include forming a hard mask film including lower and upper hard mask films on a substrate in which an active region and an isolation region are defined and patterning the hard mask film to provide a hard mask pattern partially exposing the active region and the isolation region. An etchant can be applied to the active and isolation regions using the hard mask pattern as an etching mask to form a trench in the active region of the substrate while avoiding substantially etching the isolation region exposed to the etchant and a gate can be formed on the trench.

DESCRIPTION OF EMBODIMENTS ACCORDING TO THE INVENTION

Figure 1:
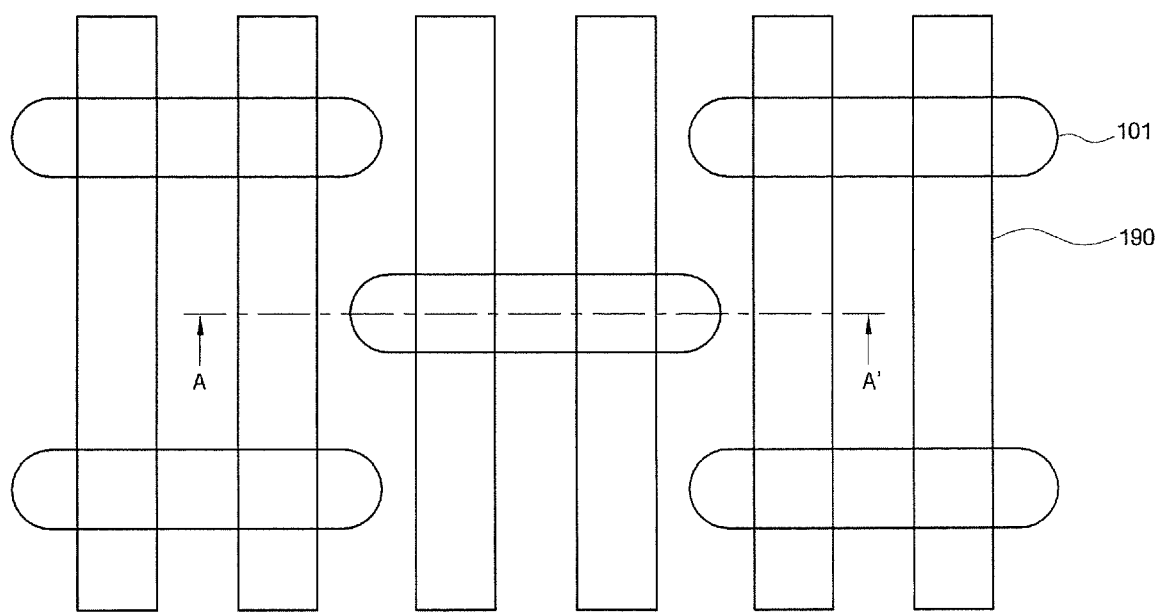
FIG. 1 is a layout of a semiconductor device to be fabricated by a semiconductor device fabrication method in some embodiments according to the present invention.

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

First of all, a semiconductor device that is fabricated by a semiconductor fabrication method in some embodiments according to the present invention will be described in detail with reference to FIGS. 1 and 2.

Figure 2:
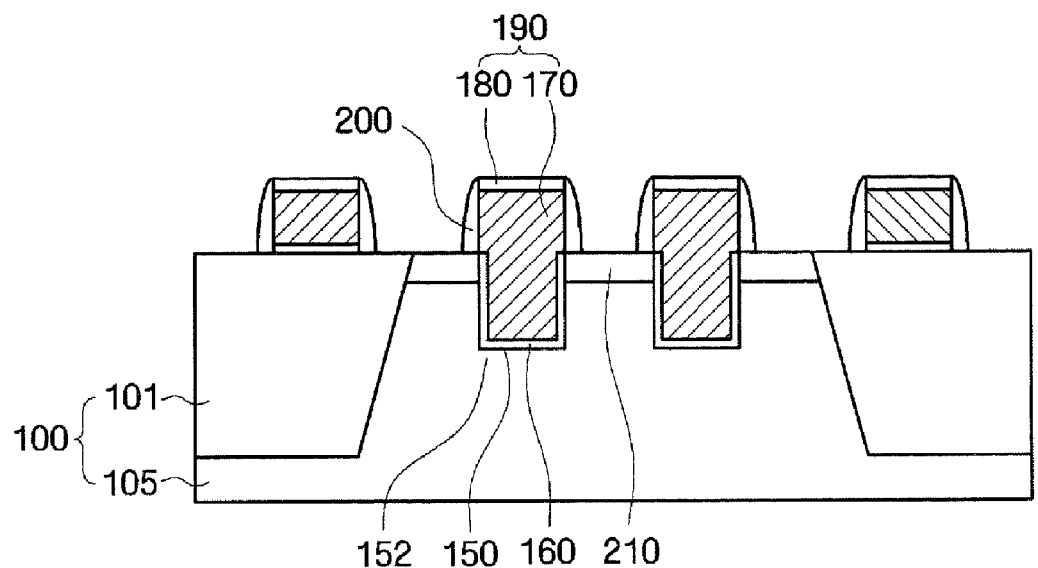
FIG. 2 is a sectional view of a semiconductor device fabricated by a semiconductor device fabrication method in some embodiments according to the present invention, which is taken along line A-A' in FIG. 1.

FIG. 1 illustrates the layout of a semiconductor device fabricated by a semiconductor fabrication method in some embodiments according to the present invention, and FIG. 2 illustrates a sectional view thereof taken along line A-A' in FIG. 1.

Referring to FIGS. 1 and 2, a plurality of active regions 105 are defined by an isolation region 101 in a semiconductor substrate 100. A recess channel array transistor is provided on the active region 105 of the semiconductor substrate 100.

More specifically, the semiconductor substrate 100 includes a plurality of trenches 150 recessed from its surface. The active region 105 around the trench 150 is formed with a recess channel 152. A gate insulating film 160 is formed on the trench 150. A gate 190 that fills the trench 150 on the recess channel 152 and simultaneously protrudes above the surface of the semiconductor substrate 100 is formed on the gate insulating film 160. The gate 190 may include an electrically conductive layer 170 and a mask layer 180. Spacers 200 are formed on both sidewalls of the gate 190.

Also, a source/drain region containing an implanted impurity is provided in the active region 105 on both sides of the gate 190. For example, when the semiconductor substrate 100 is a P-type semiconductor substrate, the source/drain region 210 may be formed by ion implanting an N-type impurity into the substrate.

Such a gate 190 of the semiconductor device is formed in such a manner as to extend across the active region 105 of the semiconductor substrate 100. Thus, the gate 190 is formed on the isolation region 101 of the semiconductor substrate 100, as well as on the active region 105 of the semiconductor substrate 100.

Here, a plurality of gates 190 may be formed on the active region 105 of the semiconductor substrate 100. By way of example, in the drawings, two gates 190 are formed on the active region 105 of the semiconductor substrate 100.

Further, although the gate 190 extends perpendicularly to the active region 105 in the drawings, the present invention is not limited thereto, and the gate 190 may extend obliquely to the active region 105.

Reference will now be made to an exemplary method of fabricating a semiconductor device as mentioned above.

FIGS. 3 to 11 sequentially illustrate a method of fabricating the semiconductor device as illustrated in FIG. 2.

Figure 3:
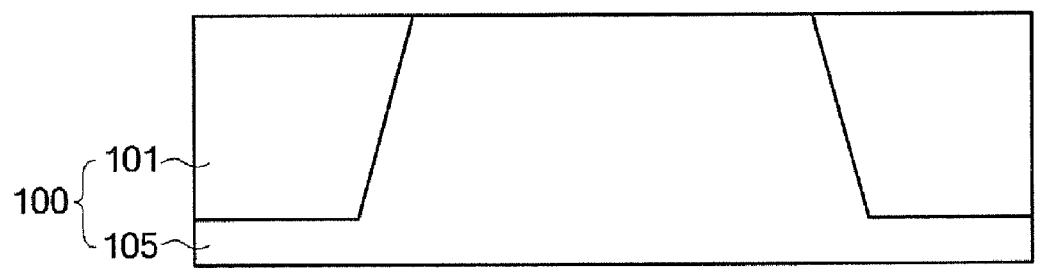
FIGS. 3 to 11 are sectional views sequentially illustrating a method of fabricating the semiconductor device in FIG. 2 in some embodiments according to the present invention.

First, as illustrated in FIG. 3, an active region 105 is defined by forming an isolation region 101 in a semiconductor substrate 100.

To be specific, the semiconductor substrate 100 may consist of at least one material selected from the group consisting of Si, Ge, SiGe, GaP, GaAs, SiC, SiGeC, InAs and InP. An isolation film is formed by means of STI (Shallow Trench Isolation) or by an FOX (Field Oxide) film within the semiconductor substrate 100, as a result of which the semiconductor substrate 100 is divided into the active region 105 and the isolation region 101.

Figure 4:
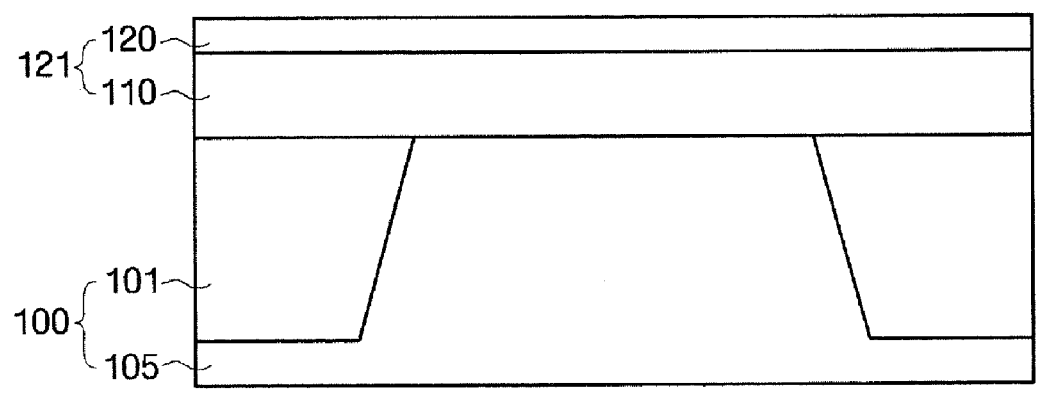

Next, as illustrated in FIG. 4, a hard mask film 121 including a lower hard mask film 10 and an upper hard mask film 120 is formed on the semiconductor substrate 100.

The lower and upper hard mask films 110, 120 may, for example, be formed in sequence by means of a vapor deposition method, such as chemical vapor deposition (CVD), low pressure chemical vapor deposition (LPCVD), plasma enhanced chemical vapor deposition (PECVD), or the like.

The lower hard mask film 110 may, for example, be formed with a thickness of 1000 to 2000 Å, and be formed of an ACL (Amorphous Carbon Layer) material, an SOC (Spin On Coating) material, a PR (photoresist) material, a low-K material, or any combination thereof.

The upper hard mask film 120 that is formed on the lower hard mask film 110 may, for example, be formed with a thickness of 400 to 1000 Å, and be formed of SiON, $SiO_2$ or any combination thereof.

Thus, an applicable combination of the lower/upper hard mask films 110, 120 may include ACL/PR films, SOC/SiON films, SOC/PETEOS films, SOC/SiO$_2$ films, low-K/SiON films, low-K/PETEOS films, and low-K/SiO$_2$ films.

Alternatively, although not illustrated in the drawings, an insulating protection film may be further formed on the semiconductor substrate 100 before the lower hard mask film 110 is formed. The insulating protection film can reduce the active and isolation regions 105, 101 of the semiconductor substrate 100, located in a portion where the lower hard mask film is etched, from being directly exposed when a lower hard mask pattern 110a is formed by selectively etching the lower hard mask film 110 in a subsequent process, thereby protecting the semiconductor substrate 100 from being partially lost. The insulating protection film may, for example, consist of SiO$_2$, SiON or any combination thereof, and be formed by means of a vapor deposition method, such as chemical vapor deposition (CVD), low pressure chemical vapor deposition (LPCVD), plasma enhanced chemical vapor deposition (PECVD), or the like.

Figure 5:
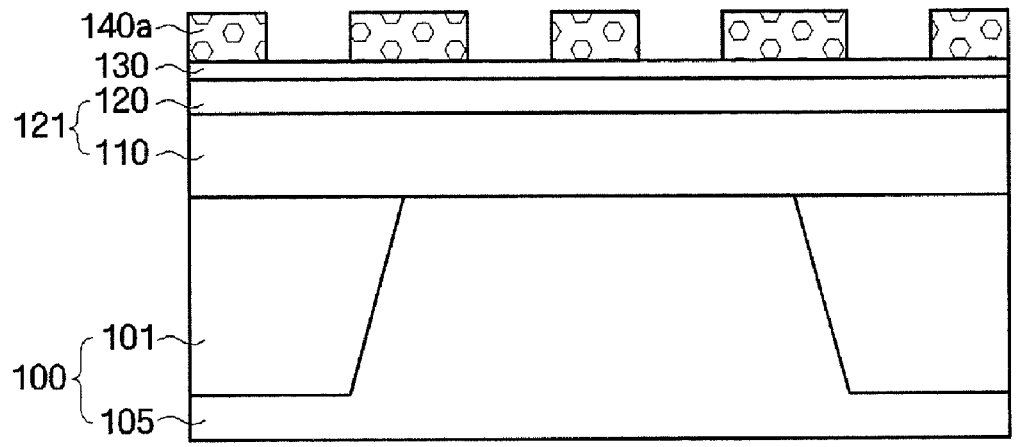

Next, as illustrated in FIG. 5, an organic antireflective film 130 and a photoresist pattern 140a are formed on the hard mask film 121.

To be specific, the organic antireflective film 130 is formed on the hard mask film 121. The organic antireflective film 130 may, for example, be formed with a thickness of 250 to 500 Å. In some cases, the organic antireflective film 130 may be omitted. Thereafter, a photoresist film is formed on the organic antireflective film 130. The photoresist film may, for example, be formed with a thickness of 1600 to 1800 Å. After that, the photoresist film is subjected to exposure and development treatment to thereby form the photoresist pattern 140a that exposes the organic antireflective film 130 located above a trench portion 150 to be formed in a subsequent process.

Figure 6:
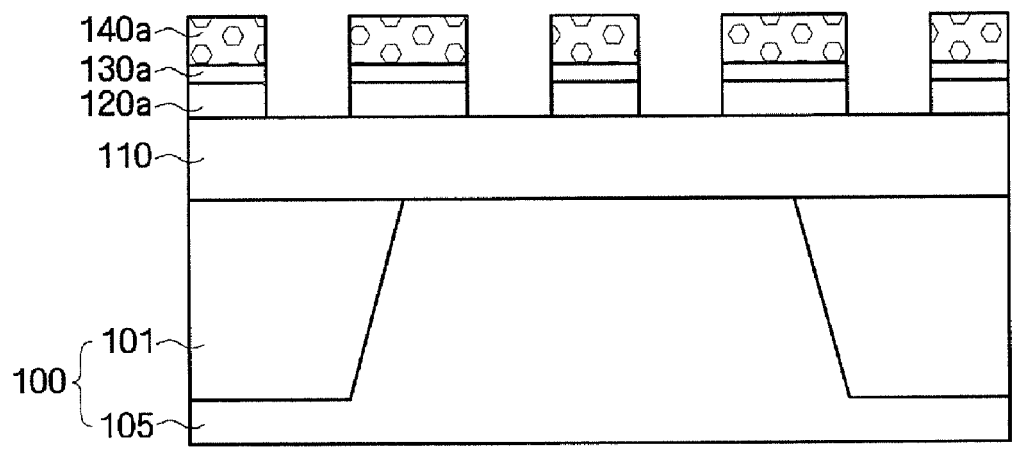

Next, as illustrated in FIG. 6, an organic antireflective film pattern 130a and an upper hard mask pattern 120a are formed by etching the exposed organic antireflective and upper hard mask films 130, 120 by using the photoresist pattern 140a as an etching mask.

An etchant used in the etching of the organic antireflective film 130 and the upper hard mask films 120 may include O$_2$, Ar, CF4 or any combination thereof.

The organic antireflective film 130 and the upper hard mask film 120 may be etched at the same time, or may be etched in sequence.

Figure 7:
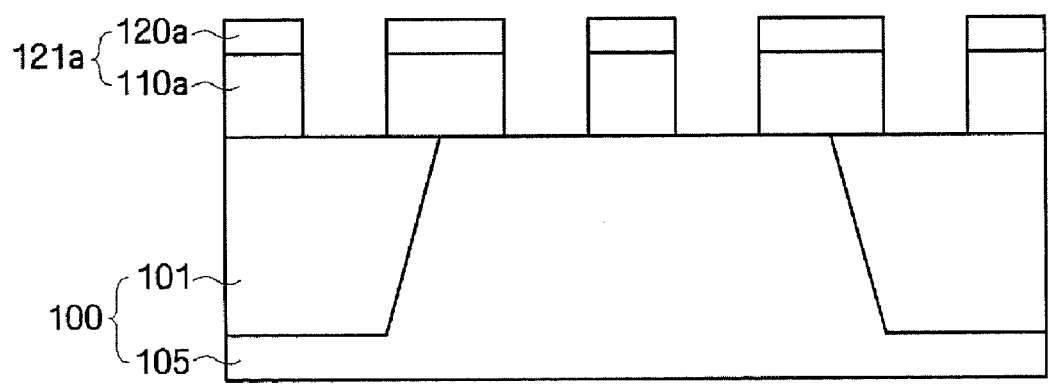

Next, as illustrated in FIG. 7, a lower hard mask pattern 110a as mentioned above is formed using the upper hard mask pattern 120a. With regard to this, the photoresist pattern 140a and the organic antireflective film pattern 130a left on the upper hard mask pattern 120a can be spontaneously removed in the process of forming the lower hard mask pattern 110a.

To be specific, the lower hard mask pattern 110a is formed using anisotropic etching. An etchant used in the anisotropic etching may consist of a material, the etch rate of which is higher for the lower hard mask film 110 than for the upper hard mask film 120.

For example, when the lower hard mask film 110 is an SOC film, and the upper hard mask pattern 120a is a PETEOS film, O$_2$, N$_2$, CO or any combination thereof may be used as an etchant.

Such an etchant may have an etch rate for the lower hard mask film 110, which is about 5 to 15 times as high as for the upper hard mask pattern 120a. Thus, the upper hard mask pattern 120a is quite capable of filling the role of an etching barrier during the etching of the lower hard mask film 110.

Also, since the upper hard mask pattern 120a is not etched during the etching of the lower hard mask film 110, the upper hard mask pattern 120a can maintain its open area. Thus, by using the upper hard mask pattern 120a as an etching mask, the etched section, that is, the side surface of the lower hard mask pattern 110a formed after the etching can have a profile almost perpendicular to the surface of the semiconductor substrate 100. As a result of this, a trench 150 to be subsequently formed in the semiconductor substrate 100 can provide CD (Critical Dimension) uniformity.

In addition, in order to reduce loss of the semiconductor substrate 100, it may be preferred to use an etchant, the etch rate of which is higher for the lower hard mask film 110 than for the isolation region 101 of the semiconductor substrate 100 when the lower hard mask pattern 110a is formed.

The resultant lower hard mask pattern 110a obtained by the etching process may include a line pattern open area shaped similar to the shape of a gate to be described below. If the open area of the lower hard mask pattern 110a is formed in a line pattern in this way, there may be an advantage in that mask alignment and linewidth may be more readily maintained. Thus, since the lower hard mask pattern 110a includes the line pattern open area, not only a part of the active region 105 but also a part of the isolation region 101 are exposed.

The active region 105 of the semiconductor substrate 100, exposed by the lower hard mask pattern 110a, corresponds to a portion where a trench 150 and a gate 190 will be formed by a subsequent etching process. The gate 190 is formed in such a manner as to extend across the active region 105. Thus, the gate may also be formed in a part of the isolation region 101, exposed by the lower hard mask pattern 110a. With regard to this, if a field recess is formed due to the etching of the isolation region 101 exposed by the lower hard mask pattern 110a, the gate formed in the isolation region may cause coupling noise, resulting from the so-called passing gate effect, to the a semiconductor device to be formed in the adjacent active region, thereby deteriorating characteristics of the semiconductor device. Therefore, it is preferred not to etch or inflict a loss on the isolation region 101 of the semiconductor substrate 100, exposed by the lower hard mask pattern 110a.

In the semiconductor device fabrication method in some embodiments according to the present invention, the etchant used in the formation of the lower hard mask pattern 110a has an etch rate that is higher for the lower hard mask film 110 than for the isolation region 101 of the semiconductor substrate 100. Consequently, it has an advantage in that the formation of a field recess in the isolation region 101 of the semiconductor substrate 100 can be reduced because the isolation region 101 exposed by the lower hard mask pattern 101a is substantially less etched. Further, since the etchant also does not inflict a loss on the active region 105 of the semiconductor substrate 100, it is easy to control the depth of a recess channel when a trench is formed in a subsequent process.

When the insulating protection film for protecting the semiconductor substrate 100 is formed on the semiconductor substrate 100 before the lower hard mask film 110 is formed, an insulating film pattern is formed using the lower hard mask pattern 110a as an etching mask. As a result of this, the active region 105 of the semiconductor substrate 100 where a trench 150 will be formed is exposed.

Figure 8:
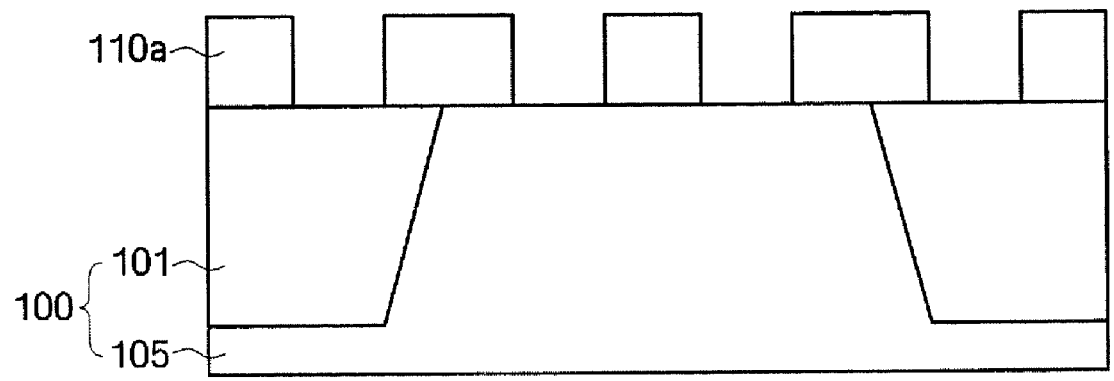

Next, as illustrated in FIG. 8, the upper hard mask pattern 120a is removed.

An etchant used in the removal of the upper hard mask pattern 120a may include CF$_4$, CHF$_3$, C$_4$F$_6$, C$_5$F$_8$, O$_2$ or any combination thereof.

In order to reduce a trench 150 from being lost, it may be preferred to remove the upper hard mask pattern 120a before rather than after forming the trench 150.

Figure 9:
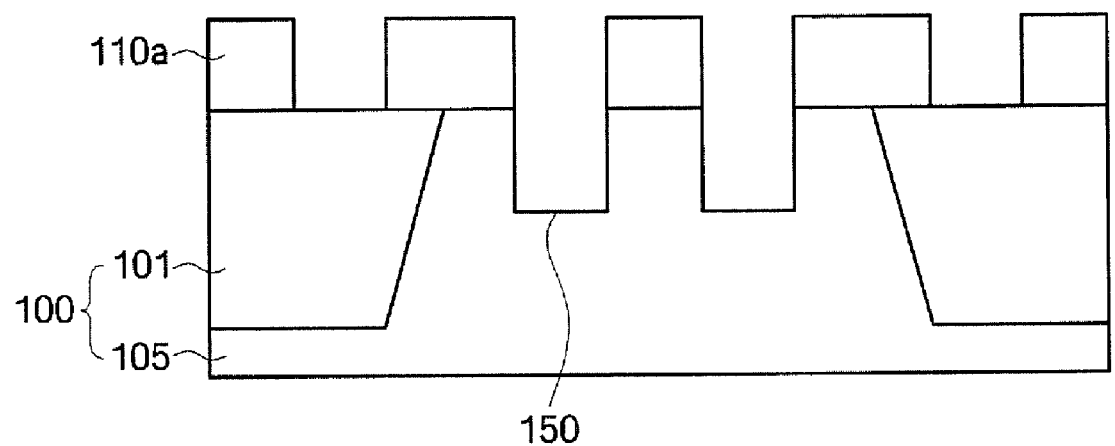

Next, as illustrated in FIG. 9, a trench 150 is formed in the semiconductor substrate 100.

To be specific, the trench 150 is formed by etching the exposed active region 105 of the semiconductor substrate 100 by using the lower hard mask pattern 110a as an etching mask. With regard to this, in the case where the insulating film pattern is formed, the insulating film pattern and the lower hard mask pattern 110a may be used together as an etching mask.

An etchant used in the etching of the exposed active region 105 may be a material, the etch rate of which is higher for the active region 105 than for the isolation region 101. For example, the etchant may include $Cl_2$, HBr, $O_2$ or any combination thereof.

Therefore, the trench 150 can be formed in the active region 105 of the semiconductor substrate 100 while loss of the isolation region 101 of the semiconductor substrate 100 is reduced.

The depth of the trench 150 formed in the active region 105 of the semiconductor substrate 100 may be about 3.5 to 1000 times as large as that of a field recess that may be formed in the isolation region 101 of the semiconductor substrate 100. In particular, while the trench 150 formed in the active region 105 of the semiconductor substrate 100 may, for example, be formed with a depth of about 50 to 200 nm, a field recess formed in the isolation region 101 of the semiconductor substrate 100 may, for example, be formed with a depth of about 15 nm or less.

In addition, by using the lower hard mask pattern 110a, the etched section of which is almost perpendicular to the semiconductor substrate 100, as an etching mask, as mentioned above, it is possible to improve the so-called bowing phenomenon in which the top portion of the trench 150 is formed with a width larger than that of the bottom portion of the trench 150. Moreover, it is possible to form the trench in such a manner as to have an inner wall that is not uneven but straight.

Figure 10:
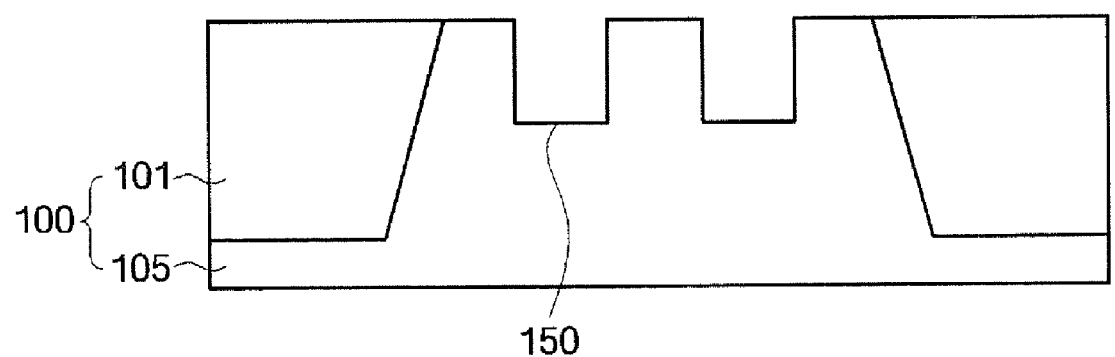

Next, as illustrated in FIG. 10, the lower hard mask pattern 110a is removed. The lower hard mask pattern 110a may be removed by an ashing process. The ashing process enables the lower hard mask pattern 110a to be easily removed without loss of the semiconductor substrate 100.

After that, when the insulating protection film for protecting the semiconductor substrate 100, which has been formed before the formation of the lower hard mask film 110, remains on the semiconductor substrate 100, it is also removed.

Figure 11:
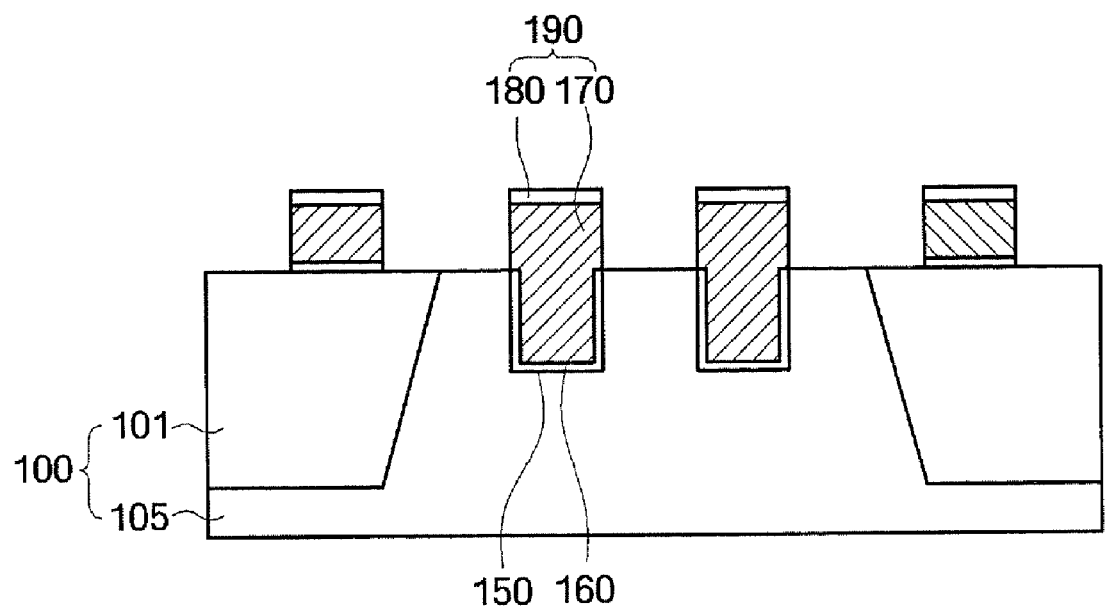

Next, as illustrated in FIG. 11, a gate insulating film 160 and a gate 190 are formed.

To be specific, the gate insulating film 160 is formed on the trench 150 in the active region 105. With regard to this, the gate insulating film 160 may be formed in a part of the isolation region 101, as well as in the active region 105. The gate insulating film 160 may, for example, be formed by a silicon oxide film, a silicon oxy-nitride film, a titanium oxide film, a tantalum oxide film, etc.

Thereafter, an electrically conductive layer 170 made of polycrystalline silicon, a metal, etc. and a mask layer 180 are laminated in sequence on the gate insulating film 160, and then are patterned to thereby form the gate with which the trench 150 is filled and which protrudes above the surface of the semiconductor substrate 100. Here, the electrically conductive layer 170 is not limited to a monolayer, and may has a multilayer structure in which a polycrystalline silicon layer and a metal layer are laminated.

Subsequently, a semiconductor device as illustrated in FIG. 2 is completed by forming a spacer 200 and a source/drain region 210.

To be specific, a silicon nitride (SiN) film or a silicon oxide ($SiO_2$) film is deposited on the gate 190 by means of a CVD method, and them is anisotropic-etched to thereby form a spacer 200 on both side surfaces of the gate 190.

Following this, an impurity is implanted into the active region 105 on both side of gate 190 to thereby form the sourced/drain region 210. With regard to this, the source/drain region 210 is formed by implanting arsenic (As), phosphorous (P) or the like when the semiconductor device is an N-type MOS transistor, and is formed by implanting boron (B) or the like when the semiconductor device is a P-type MOS transistor.

Figure 12:
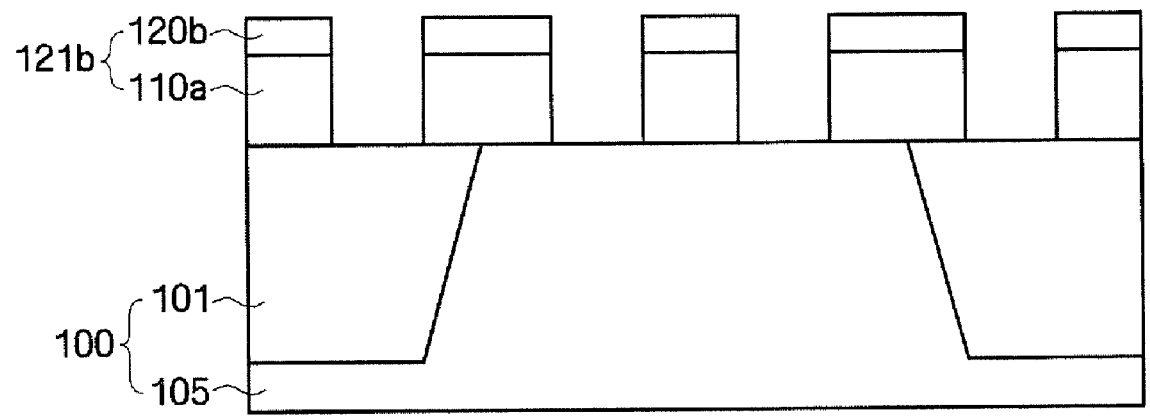
FIGS. 12 and 13 are sectional views for explaining a method of fabricating a semiconductor device in some embodiments according to the present invention.
Figure 13:
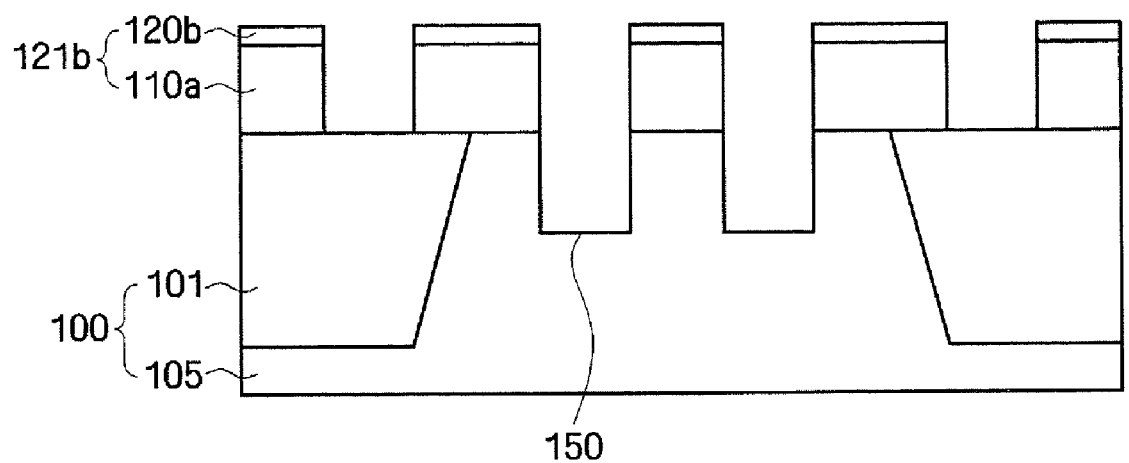

FIGS. 12 and 13 illustrate sectional view for explaining a semiconductor fabrication method in some embodiments according to the present invention.

Reference will now be made to another exemplary method of fabricating a semiconductor device as illustrated in FIG. 2, with reference to FIGS. 12 and 13.

As illustrated in FIG. 12, a lower hard mask film 110, an upper hard mask film 120, an organic antireflective film 130, and a photoresist film are laminated on a semiconductor substrate 100, and are patterned in such a manner as to form a hard mask pattern 121b in which a lower hard mask pattern 110a and an upper hard mask pattern 120b are laminated. Individual steps of such a process are substantially the same as those described above with reference to FIGS. 1 to 7, However, the upper hard mask pattern 120b is different from that mentioned in FIG. 7 in that it consists of an antireflective material, such as Si-ARC (Anti Reflective Coating), etc.

When the upper hard mask pattern 120b consists of Si-ARC, the Si content with respect to the total material content may be about 20 to 45%. The Si content has an effect on the etch rate for the upper hard mask pattern 120b. For example, the larger the Si content of the upper hard mask pattern, the smaller the etch rate for the upper hard mask pattern 120b. In view of this, if the Si content is controlled within the aforementioned range, the etch rate for the upper hard mask pattern 120b can be simply and easily controlled.

Thus, it can be appreciated that the upper hard mask pattern 120b with the increased Si content has a high etching selection ratio for an etchant, and thus can more effectively serve as an etching barrier during the formation of the lower hard mask pattern 110a.

Next, as illustrated in FIG. 13, a trench 150 is formed in the semiconductor substrate 100.

To be specific, the trench 150 is formed in the semiconductor substrate 100 by using the hard mask pattern 121b with the laminated lower and upper hard mask patterns 110a, 120b as an etching mask. An etchant used in the formation of the trench 150 may include $Cl_2$, HBr, $O_2$ or any combination thereof. This etchant etches the active region 105 of the semiconductor substrate 100, exposed by the hard mask pattern 121b, to thereby form the trench 150. Here, during the formation of the trench 150, a part of the upper hard mask pattern 120b may also be etched, which leads the upper hard mask pattern 120b to be further thinner, as illustrated in FIG. 13. As the upper hard mask pattern 120b is thinned, it can be simply and easily removed in a subsequent process. Furthermore, the upper hard mask pattern 120b may be completely removed. In this case, a subsequent step of removing the upper hard mask pattern 120b can be omitted.

A way to remove the upper hard mask pattern 120b is not limited to the above illustration. For example, the upper hard mask pattern 120b may be first removed before the trench 150 is formed. However, a process of removing the upper hard mask pattern 120b simultaneously with the formation of the trench 150 is advantageous in that it can reduce the number of process steps.

Also, in contrast to other etchants that have been conventionally used for etching the hard mask pattern, such as SiON, $SiO_2$ and so forth, the etchant used in the etching of the upper hard mask pattern 120b can more simply and easily remove the upper hard mask pattern 120b without doing damage to the isolation region 101 of the semiconductor substrate 100.

In other words, by using the hard mask pattern 121b in which the upper hard mask pattern 120b consisting of Si-ARC is laminated on the lower hard mask pattern 110a consisting of an ACL, SOC, PR, Low-K material, or any combination thereof, the trench 150 can be formed in the active region 105 of the semiconductor substrate 100 while the formation of a field recess in the isolation region 101 of the semiconductor substrate 100 is reduced. Consequently, it is possible to reduce deterioration of the semiconductor device from being caused by coupling noise that may occur as the isolation region 101 of the semiconductor substrate 100 is etched to thereby form a field recess.

Further, by using the lower hard mask pattern 110a, the etching section of which is almost perpendicular to the semiconductor substrate 100, as an etching mask, the trench 150 formed in the active region 105 of the semiconductor substrate 100 can be improved in the so-called bowing phenomenon.

Finally, the semiconductor device as illustrated in FIG. 2 is completed by subsequent processes.

Hereinafter, a description will be given of a comparison between profiles of a semiconductor device formed by a semiconductor device fabrication method according to the present invention and a semiconductor device formed using an SiON film as a hard mask film, with reference to FIGS. 14 and 15.

Figure 14:
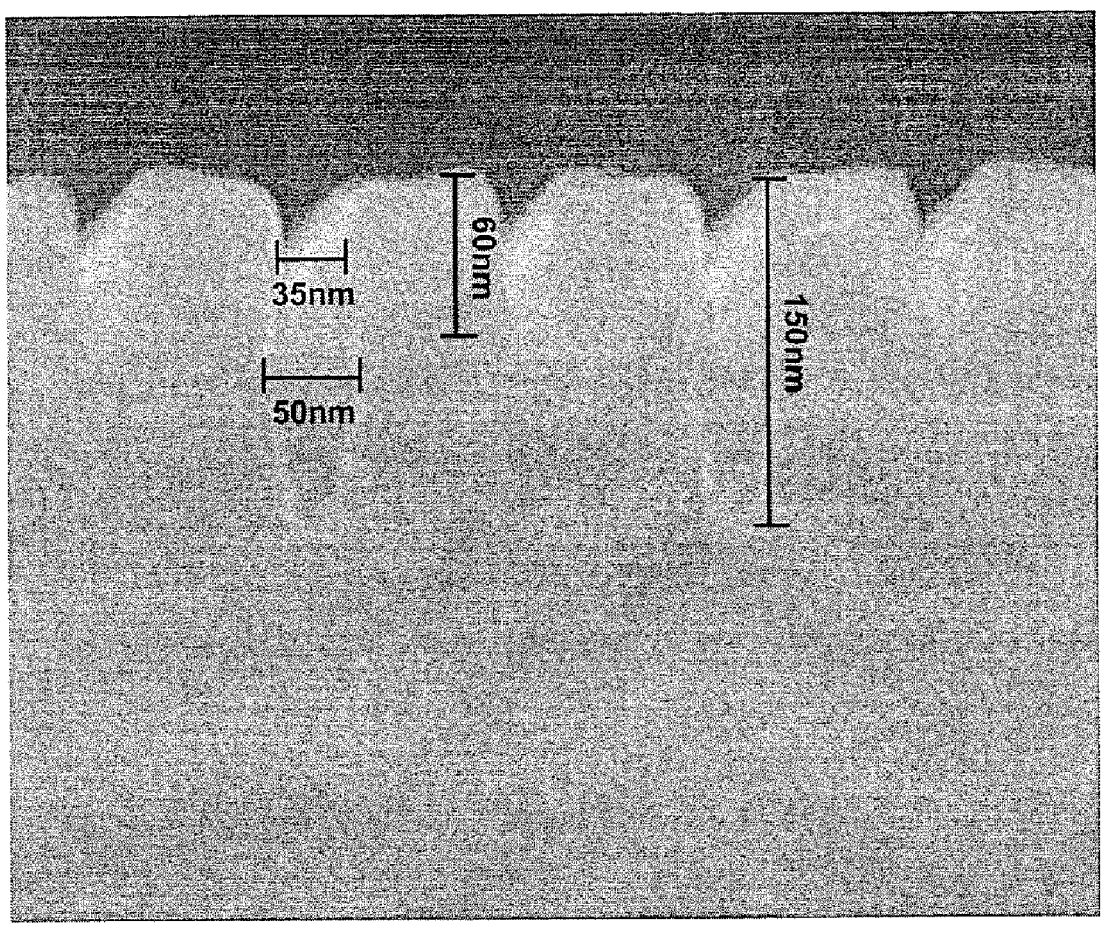
FIG. 14 is a picture illustrating a profile of a semiconductor device formed using a hard mask film consisting of an SiON film in some embodiments according to the present invention.
Figure 15:
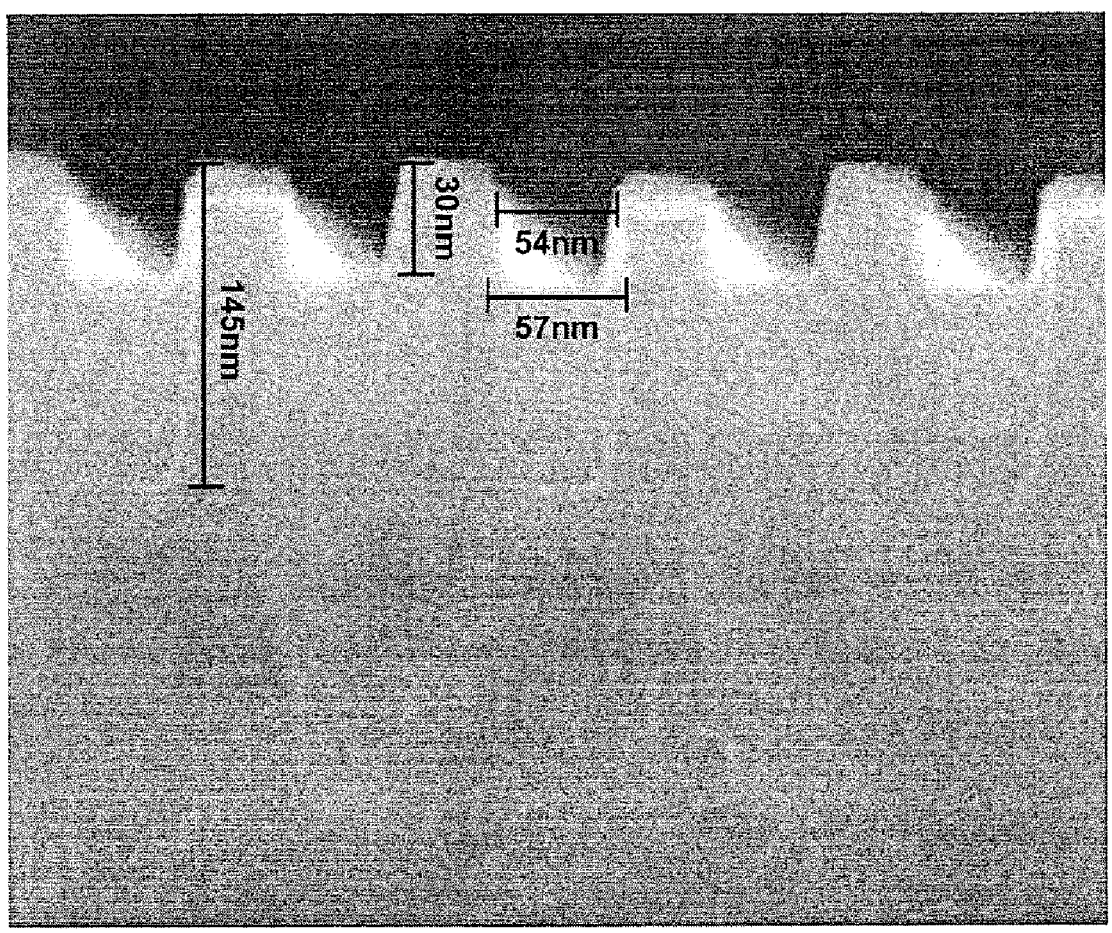
FIG. 15 is a picture of a semiconductor device formed by a semiconductor device fabrication method in some embodiments according to the present invention.

FIG. 14 illustrates a picture of a semiconductor device formed using an SiON film as a hard mask film, and FIG. 15 illustrates a picture of a semiconductor device formed using a hard mask film that includes a lower ACL film and an upper Si-ARC film according to the present invention.

Referring to FIGS. 14 and 15, when the depth of a trench formed in an active region of a semiconductor substrate is about 150 nm, a field recess formed in an isolation region of the semiconductor device has a depth of about 60 nm or less in the case of the semiconductor device of FIG. 14, but has a depth of about 30 nm or less in the case of the semiconductor device of FIG. 15. Thus, it can be noted that loss of the isolation region may be improved in some embodiments according to the present invention.

As for the trench formed in the active region of the semiconductor substrate, it can be also noted that a difference between the width of a trench top portion and the width of a trench bottom portion is about 15 nm in the case of the semiconductor device of FIG. 14, but the corresponding difference is reduced to about 15 nm and the inner wall of the trench is formed in such a manner as to have a substantially vertical slope in the case of the semiconductor device of FIG. 15. Consequently, it can be identified that the bowing phenomenon of the trench is improved by the present invention.

As described above, in some embodiments according to the present invention, a recess channel trench in formed in an active region while reducing the formation of a field recess in an isolation region. Therefore, not only coupling noise can be reduced, but also sufficient transistor channel length may be provided, so that the semiconductor device fabricated in this way can be improved in its characteristics, such as a refresh characteristic, etc.

Although exemplary embodiments of the present invention have been described for illustrative purposes, those skilled in the art will appreciate that various modifications, additions and substitutions are possible, without departing from the essential features and the scope and spirit of the invention as disclosed in the accompanying claims. Therefore, it should be appreciated that the embodiments described above are not limitative, but only illustrative.

What is claimed:

1. A method of fabricating a semiconductor device, the method comprising:
   forming a hard mask film including lower and upper hard mask films on a substrate in which an active region and an isolation region are defined;
   patterning the hard mask film to provide a hard mask pattern partially exposing the active region and the isolation region; and
   applying an etchant to the active and isolation regions using the hard mask pattern as an etching mask to form a trench in the active region of the substrate while avoiding substantially etching the isolation region exposed to the etchant wherein applying an etchant comprises etching using the etchant having an etch rate which is greater for the active region than for the isolation region.

2. The method of claim 1 wherein the lower hard mask film comprises an amorphous carbon layer (ACL) material, a spin on coating (SOC) material, a photoresist (PR) material, a low-K material, or any combination thereof, and the upper hard mask film comprises of a silicon-antireflective coating (Si-ARC) material, plasma enhanced tetraethyl orthosilicate (PETEOS), SiON, $SiO_2$, or any combination thereof.

3. The method of claim 1, wherein the lower/upper hard mask films includes ACL/Si-ARC films, ACL/PR films, SOC/Si-ARC films, SOC/SiON films, SOC/PETEOS films, $SOC/SiO_2$ films, low-K/Si-ARC films, low-K/SiON films, low-KRETEOS films, or low-K/$SiO_2$ films.

4. The method of claim 1, wherein forming the hard mask pattern comprises:
   forming a photoresist pattern on the hard mask film;
   etching the upper hard mask film using the photoresist pattern as a first mask to form an upper hard mask pattern; and
   etching the lower hard mask film using the upper hard mask pattern as a second mask to form a lower hard mask pattern.

5. The method of claim 4, wherein the lower hard mask pattern comprises a side profile substantially perpendicular to a surface of the substrate in a portion where the lower hard mask pattern exposes the substrate.

6. The method of claim 4, wherein the forming the lower hard mask pattern comprises etching the lower hard mask film using a second etchant having an etch rate which is greater for the lower hard mask film than for the upper hard mask film.

7. The method of claim 6, wherein the etch rate of the second etchant on the lower hard mask film is about 5 to about 15 times greater than on the upper hard mask film.

8. The method of claim 6, wherein the etch rate of the second etchant on the lower hard mask pattern is greater than on the isolation region of the substrate.

9. The method of claim 6, wherein the second etchant includes $O_2$, $N_2$, CO, or any combination thereof.

10. The method of claim 4, further comprising:
    forming an organic antireflective film on the hard mask film before the forming the photoresist pattern; and etching the organic antireflective film using the photoresist pattern as a third mask to form an organic antireflective pattern, before the forming the hard mask pattern.

11. The method of claim 1, further comprising:
forming an insulating film on the substrate before the forming the hard mask film; and
etching the insulating film by using the hard mask pattern as the etching mask to thereby form an insulating film pattern, after the forming the hard mask pattern,
wherein applying an etchant comprises etching the substrate using the insulating film pattern and the lower hard mask pattern as a second etching mask.

12. The method of claim 11, wherein the insulating film comprises $SiO_2$, SiON, medium temperature oxide (MTO), or any combination thereof.

13. The method of claim 1, wherein the upper hard mask film comprises an Si-ARC material with an Si content of about 20 to about 45%.

14. The method of claim 1, wherein applying an etchant comprises forming a field recess in the isolation region, and a depth of the trench is about 3.5 to 1000 times as deep as the field recess.

15. The method of claim 1, wherein applying an etchant comprises forming a field recess in the isolation region, and the trench and the field recess have respective depths of about 50 to about 200 nm and about 15 nm or less.

16. The method of claim 1, wherein the etchant comprises $Cl_2$, HBr, $O_2$, or any combination thereof.

17. A method of fabricating a semiconductor device, the method comprising:
forming a lower hard mask film including carbon on a substrate in which an active region and an isolation region are defined;
forming an upper hard mask film on the lower hard mask film;
patterning the upper and lower hard mask films to form upper and lower hard mask patterns partially exposing the active region and the isolation region;
performing an etching process using the lower hard mask pattern as an etching mask to thereby form a trench in the active region of the substrate and simultaneously remove a portion of the upper hard mask pattern; and
forming a gate on the trench, wherein performing the etching process comprises performing etching by using an etchant, an etch rate of which is greater on the active region than on the isolation region.

18. The method of claim 17, wherein the lower hard mask film comprises an ACL material, an SOC material, a PR material, a low-K material, or any combination thereof.

19. The method of claim 17, wherein the upper hard mask film comprises an Si-ARC material.

20. The method of claim 17, wherein forming the upper and lower hard mask pattern comprises:
forming a photoresist pattern on the upper hard mask film;
etching the upper hard mask film by using the photoresist pattern as an etching mask to thereby form the upper hard mask pattern; and
etching the lower hard mask film by using the upper hard mask pattern as an etching mask to thereby form the lower hard mask pattern.

21. The method of claim 20, wherein an etchant used in forming the lower hard mask pattern has an etch rate for the lower hard mask film, which is about 5 to 15 times as high as for the upper hard mask film.

22. The method of claim 17, further comprising removing the lower hard mask pattern remaining around and/or on the trench by ashing, after forming the trench.

* * * * *